US012653045B2

(12) United States Patent
Chen et al.

(10) Patent No.: US 12,653,045 B2
(45) Date of Patent: Jun. 9, 2026

(54) PACKAGING STRUCTURE FOR REALIZING CHIP INTERCONNECTION AND MANUFACTURING METHOD THEREOF

(71) Applicant: Zhuhai YUEXiN Semiconductor Limited Liability Company, Zhuhai (CN)

(72) Inventors: Xianming Chen, Zhuhai (CN); Yejie Hong, Zhuhai (CN); Benxia Huang, Zhuhai (CN); Gao Huang, Zhuhai (CN); Xiaofeng Deng, Zhuhai (CN)

(73) Assignee: Zhuhai YUEXIN Semiconductor Limited Liability Company, Zhuhai (CN)

( * ) Notice: Subject to any disclaimer, the term of this patent is extended or adjusted under 35 U.S.C. 154(b) by 374 days.

(21) Appl. No.: 18/318,712

(22) Filed: May 16, 2023

(65) Prior Publication Data

US 2024/0021525 A1     Jan. 18, 2024

(30) Foreign Application Priority Data

Jul. 15, 2022    (CN) .......................... 202210830138.9

(51) Int. Cl.
*H10W 70/60* (2026.01)
*H10W 20/00* (2026.01)
(Continued)

(52) U.S. Cl.
CPC .......... *H10W 70/611* (2026.01); *H10W 20/01* (2026.01); *H10W 70/095* (2026.01);
(Continued)

(58) Field of Classification Search
CPC ............... H01L 23/5384; H01L 21/486; H01L 23/5381; H01L 23/5221; H10W 70/611;
(Continued)

(56) References Cited

U.S. PATENT DOCUMENTS

2015/0279817 A1* 10/2015 Zhang ................. H01L 25/0657
257/777
2019/0206791 A1 7/2019 Pietambaram et al.
(Continued)

FOREIGN PATENT DOCUMENTS

CN 1518080 A 8/2004
CN 108140615 A 6/2018
(Continued)

OTHER PUBLICATIONS

First Office Action for Chinese Patent Application No. 2022108301389 and English translation, mailed Apr. 13, 2023, 14 pages.
(Continued)

*Primary Examiner* — Amar Movva
(74) *Attorney, Agent, or Firm* — Buchalter; Jason W. Croft

(57) ABSTRACT

A packaging structure for realizing chip interconnection includes a core layer, a bridging layer, a first dielectric layer, a second dielectric layer, a first bonding pad layer and a second bonding pad layer. The first dielectric layer is arranged between the core layer and the first bonding pad layer, the second dielectric layer is arranged between the second bonding pad layer and the core layer. The first bonding pad layer is connected with the core layer through a first via, the second bonding pad layer is connected with the core layer through a second via. The bridging layer is embedded in the first dielectric layer. The bridging layer is electrically insulated from the core layer, and the bridging layer is connected with the first bonding pad layer through a third via.

10 Claims, 5 Drawing Sheets

(51) Int. Cl.

| | |
|---|---|
| *H10W 70/05* | (2026.01) |
| *H10W 70/63* | (2026.01) |
| *H10W 70/65* | (2026.01) |
| *H10W 70/685* | (2026.01) |
| *H10W 90/00* | (2026.01) |

(52) U.S. Cl.
CPC ......... *H10W 70/635* (2026.01); *H10W 70/65* (2026.01); *H10W 70/685* (2026.01); *H10W 90/00* (2026.01)

(58) Field of Classification Search
CPC ............. H10W 70/635; H10W 70/095; H10W 70/65–658; H10W 20/432
See application file for complete search history.

(56) References Cited

U.S. PATENT DOCUMENTS

| | | |
|---|---|---|
| 2021/0028080 A1 | 1/2021 | Pietambaram et al. |
| 2021/0183753 A1 | 6/2021 | Sakuma et al. |
| 2022/0130743 A1 | 4/2022 | Sarkar et al. |

FOREIGN PATENT DOCUMENTS

| | | |
|---|---|---|
| JP | 2014049578 A | 8/2012 |
| KR | 20140065473 A | 5/2014 |
| TW | 202111895 A | 3/2021 |

OTHER PUBLICATIONS

Second Office Action for Chinese Patent Application No. 2022108301389 and English translation, mailed Aug. 26, 2023, 15 pages.

First Office Action for Japanese Patent Application No. 2023-081498 and English translation, mailed Jan. 2, 2024, 6 pages.

First Office Action for Korean Patent Application No. 10-2023-0065050 and English translation, mailed Jun. 11, 2024, 21 pages.

First Office Action for Taiwanese Patent Application No. 112114237 and English translation, mailed Jan. 31, 2024, 14 pages.

Rejection Decision for Taiwanese Patent Application No. 112114237 and English translation, mailed Jul. 29, 2024, 11 pages.

First Office Action after reexamination for Taiwanese Patent Application No. 112114237 and English translation, mailed Nov. 1, 2024, 20 pages.

Second Office Action after reexamination for Taiwanese Patent Application No. 112114237 and English translation, mailed Mar. 19, 2025, 20 pages.

* cited by examiner a b c d e

PACKAGING STRUCTURE FOR REALIZING CHIP INTERCONNECTION AND MANUFACTURING METHOD THEREOF

CROSS-REFERENCE TO RELATED APPLICATION

This application is based on and claims the benefit of priority from Chinese Patent Application No. 2022108301389, filed on 15 Jul. 2022, the entirety of which is incorporated by reference herein.

TECHNICAL FIELD

The disclosure relates to the technical field of integrated circuits, and particularly to a packaging structure for realizing chip interconnection, a manufacturing method thereof, and a semiconductor device.

BACKGROUND

With the increasing development of electronic technology, the performance requirements of electronic products are getting higher and higher, thus the electronic components and substrate circuits of circuit boards are getting more and more complicated. Meanwhile, the sizes of electronic products are required to be smaller and thinner. Therefore, the high-density integration, miniaturization and multifunction of packaging substrates of electronic components, such as a chip, are inevitable trends. Driven by the short, small, light and thin features of electronic products, the semiconductor packaging industry has higher requirements for functions of the chip, so that the chip requires more I/O ports, and the size and spacing of the I/O ports are required to be smaller. When the functions of a single chip cannot meet the performance requirements of a product, multiple chips need to be interconnected to meet the requirements. In the existing technology, it is necessary to separately manufacture a TSV (Through Silicon Via) or TGV (Through Glass Via) intermediate layer for chip interconnection, which has a high cost. Moreover, the TSV/TGV intermediate layer has a large thickness, which increases a volume of a packaging module and cannot really realize the short, small, light and thin features of the packaging module. Furthermore, the TSV/TGV intermediate layer realizes multi-chip interconnection, with a low degree of freedom in design. A chip of a 2.5D packaging structure is attached to a surface of the TSV/TGV intermediate layer, and the intermediate layer and a packaging carrier are interconnected by soldering, with a relatively low integration degree. Therefore, a new packaging structure for realizing chip interconnection is needed.

SUMMARY

The disclosure aims to solve at least one of the technical problems in the existing technology.

An object of an embodiment of the disclosure is to provide a packaging structure for realizing chip interconnection, a manufacturing method thereof, and a semiconductor device. The packaging structure for realizing chip interconnection can improve a product integration degree and reduce a manufacturing cost.

In order to achieve the above technical object, an embodiment of the disclosure provides a packaging structure for realizing chip interconnection, which is used for being connected with a PCB, and includes: a core layer, a bridging layer, a first dielectric layer, a second dielectric layer, a first via, a second via, a third via, a first bonding pad layer and a second bonding pad layer; where, the first dielectric layer is arranged on a first surface of the core layer; the second dielectric layer is arranged on a second surface of the core layer opposite to the first surface; the first dielectric layer is arranged between the core layer and the first bonding pad layer; the second dielectric layer is arranged between the second bonding pad layer and the core layer; the first bonding pad layer is connected with the core layer through the first via; the second bonding pad layer is connected with the core layer through the second via; the bridging layer is embedded in the first dielectric layer; the bridging layer is electrically insulated from the core layer; the bridging layer is connected with the first bonding pad layer through the third via; the first bonding pad layer is used for being connected with a chip; the second bonding pad layer is used for being connected with the PCB; and the bridging layer is used for interconnecting two chips.

In addition, the packaging structure for realizing chip interconnection according to the above embodiment of the disclosure may all have the following additional technical features.

Further, in the embodiment of the disclosure, the core layer includes: a substrate, a first sub-circuit layer, a second sub-circuit layer, a third sub-circuit layer, a fourth sub-circuit layer, a fourth via, a fifth via, a sixth via, a third dielectric layer and a fourth dielectric layer; where, the first sub-circuit layer is arranged on a first surface of the substrate; the second sub-circuit layer is arranged on a second surface of the substrate opposite to the first surface, and the first sub-circuit layer and the second sub-circuit layer are connected through the fourth via; the fourth via is arranged in the substrate; the third dielectric layer is arranged between the third sub-circuit layer and the first sub-circuit layer; the third sub-circuit layer and the first sub-circuit layer are connected through the fifth via arranged in the third dielectric layer; the fourth dielectric layer is arranged between the fourth sub-circuit layer and the second sub-circuit layer; and the fourth sub-circuit layer and the second sub-circuit layer are connected through the sixth via arranged in the fourth dielectric layer.

Further, in the embodiment of the disclosure, the bridging layer includes one or more connection bridges.

Further, in the embodiment of the disclosure, the bridging layer includes at least one of a thin film circuit layer, a silicon intermediate layer, a glass intermediate layer or a chip.

Further, in the embodiment of the disclosure, the first dielectric layer includes at least one of a viscous dielectric material, a thermosetting dielectric material or a photosensitive dielectric material.

In another aspect, an embodiment of the disclosure further provides a manufacturing method of a packaging structure for realizing chip interconnection, which is used for manufacturing the packaging structure for realizing chip interconnection according to any one of the above embodiments, and includes:

forming the core layer;

applying the first dielectric layer on the first surface of the core layer; and applying the second dielectric layer on the second surface of the core layer;

in a process of applying the first dielectric layer, embedding the bridging layer in the first dielectric layer;

forming the first via and the third via in the first dielectric layer; arranging the first via between the core layer and the first bonding pad layer, and arranging the third via between the bridging layer and the first bonding pad layer; and forming the second via in the second dielectric layer; and forming the first bonding pad layer on the first via and the third via, and forming the second bonding pad layer on the second via.

Further, in the embodiment of the disclosure, the manufacturing method of a packaging structure for realizing chip interconnection further includes: attaching the chip on the first bonding pad layer and soldering the PCB on the second bonding pad layer.

Further, in the embodiment of the disclosure, forming the core layer, includes:

forming the first sub-circuit layer on the first surface of the substrate, forming the second sub-circuit layer on the opposite second surface, and forming the fourth via in the substrate;

applying the third dielectric layer on the first sub-circuit layer and applying the fourth dielectric layer on the second sub-circuit layer, and windowing the third dielectric layer and the fourth dielectric layer; and forming the fifth via and the third sub-circuit layer on the third dielectric layer, and forming the sixth via and the fourth sub-circuit layer on the fourth dielectric layer.

The advantages and beneficial effects of the disclosure will be given in part in the following description, and will become apparent in part from the following description, or will be learned through the practice of the disclosure.

According to the disclosure, two or even more chips may be interconnected by arranging the bridging layer and the third via embedded in the first dielectric layer, and the core layer of the packaging structure may be connected with the chip through the first bonding pad layer and the first via; and the core layer of the packaging structure and the PCB may be interconnected through the second bonding pad layer and the second via, so that the interconnection of the packaging structure with the PCB and the chip, and the high-density integration of interconnection among multiple chips are finally realized, and a manufacturing cost is reduced.

DETAILED DESCRIPTION

Embodiments of the disclosure are described in detail hereinafter with reference to the drawings.

Figure 1:
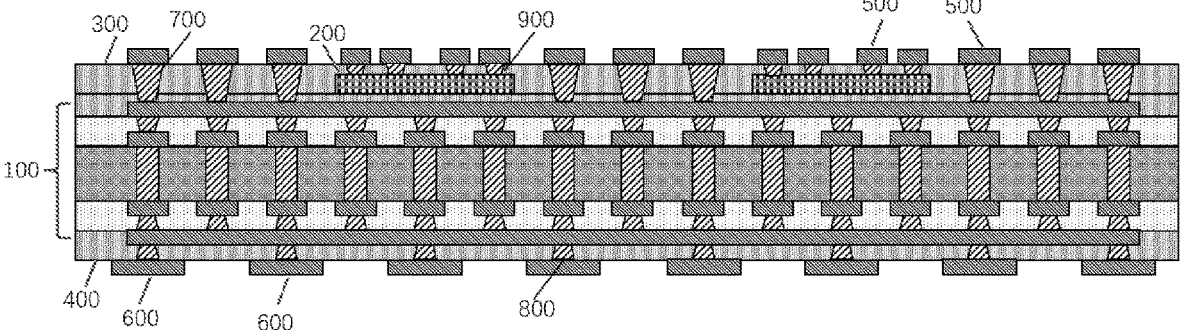
FIG. 1 is a schematic structural diagram of a packaging structure for realizing chip interconnection according to an embodiment of the disclosure.

With reference to FIG. 1, a packaging structure for realizing chip interconnection of the disclosure may be connected with a PCB to realize a circuit function.

The packaging structure includes a core layer 100, a bridging layer 200, a first dielectric layer 300, a second dielectric layer 400, a first bonding pad layer 500, a second bonding pad layer 600, a first via 700, a second via 800 and a third via 900.

The first dielectric layer 300 may be arranged on a first surface of the core layer 100. The second dielectric layer 400 may be arranged on a second surface of the core layer 100 opposite to the first surface. The first dielectric layer and the second dielectric layer may have the same thickness or different thicknesses.

The first dielectric layer 300 may be arranged between the core layer 100 and the first bonding pad layer 500. The second dielectric layer 400 may be arranged between the second bonding pad layer 600 and the core layer 100. The first bonding pad layer 500 may be connected with the core layer 100 through the first via 700. The first via may be arranged inside the first dielectric layer. The second bonding pad layer 600 may be connected with the core layer 100 through the second via 800. The bridging layer 200 may be embedded in the first dielectric layer 300, the bridging layer 200 may be connected with the first bonding pad layer 500 through the third via 900. Similar to the first via 700, the third via 900 may also be arranged inside the first dielectric layer, and the bridging layer 200 may be electrically insulated from the core layer 100. The first bonding pad layer 500 may be used for being connected with a pin or a connection ball of a chip. The second bonding pad layer 600 may be used for being connected with the PCB. The bridging layer 200 may be used for interconnecting two chips. In addition, because the first bonding pad layer 500 may be connected with the core layer 100 and connected with the bridging layer 200 and electrical requirements of these two layers may be different, each sub-bonding pad of the first bonding pad layer 500 may be set to have a different volume.

Figure 2:
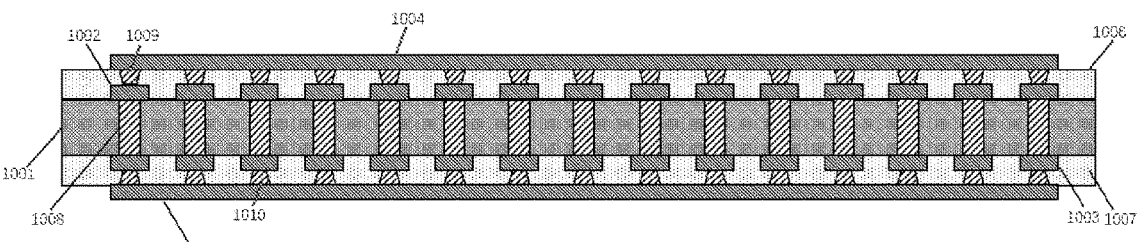
FIG. 2 is a schematic structural diagram of a core layer of the packaging structure for realizing chip interconnection according to an embodiment of the disclosure.

Further, in some embodiments of the disclosure, with reference to FIG. 2, the core layer 100 may comprise a substrate 1001, a first sub-circuit layer 1002, a second sub-circuit layer 1003, a third sub-circuit layer 1004, a fourth sub-circuit layer 1005, a third dielectric layer 1006, a fourth dielectric layer 1007, a fourth via 1008, a fifth via 1009 and a sixth via 1010.

The first sub-circuit layer 1002 is arranged on a first surface of the substrate 1001. The second sub-circuit layer 1003 is arranged on a second surface of the substrate 1001 opposite to the first surface, and the first sub-circuit layer 1002 and the second sub-circuit layer 1003 are connected through the fourth via 1008. The fourth via is arranged in the substrate 1001. The third dielectric layer 1006 is arranged between the third sub-circuit layer 1004 and the first sub-circuit layer 1002, and the third sub-circuit layer 1004 and the first sub-circuit layer 1002 are connected through the fifth via 1009 arranged in the third dielectric layer 1006. The fourth dielectric layer 1007 is arranged between the fourth sub-circuit layer 1005 and the second sub-circuit layer 1003, and the fourth sub-circuit layer 1005 and the second sub-circuit layer 1003 are connected through the sixth via 1010 arranged in the fourth dielectric layer 1007. In addition, in some embodiments of the disclosure, a material of the third dielectric layer may be the same as that of the fourth dielectric layer.

Further, in some embodiments of the disclosure, the bridging layer includes one or more connection bridges. Specifically, because more than two chips may be interconnected in the disclosure, one or more bridging layers may be correspondingly arranged. When two chips are interconnected, one connection bridge may be arranged in the bridging layer, and when N chips need to be interconnected, N−1 connection bridges may be arranged in the bridging layer. In addition, when the electrical requirements of the chips to be interconnected are different, parameters, such as a length, a width and a thickness, of each connection bridge may be set to be the same, or some parameters or all parameters may be set to be different according to actual needs.

Further, in some embodiments of the disclosure, the bridging layer can realize interconnection among multiple chips, and may be a high-precision structure capable of realizing electrical interconnection. Therefore, the bridging layer may comprise at least one of a thin film circuit layer, a silicon intermediate layer, a glass intermediate layer or a chip.

Further, in some embodiments of the disclosure, the first dielectric layer includes at least one of a viscous dielectric material, a thermosetting dielectric material or a photosensitive dielectric material. When the first dielectric layer includes two of the viscous dielectric material, the thermosetting dielectric material or the photosensitive dielectric material, the first dielectric layer is divided into two sub-dielectric layers comprising a first sub-dielectric layer and a second sub-dielectric layer, and the two sub-dielectric layers with different materials may be respectively applied to the core layer. For example, the first sub-dielectric layer made of the viscous dielectric material is applied first, and then the second sub-dielectric layer made of the thermosetting dielectric material is applied on the basis of the sub-dielectric layer made of the viscous dielectric material. The first dielectric layer may also be formed by layering and mixing the first sub-dielectric layer, the second sub-dielectric layer and the third sub-dielectric layer respectively made of the three materials. Specifically, in the disclosure, the first sub-dielectric layer made of the viscous dielectric material is applied first, the bridging layer is arranged on a surface of the first sub-dielectric layer made of the viscous dielectric material, the bridging layer may be well fixed through the viscous dielectric material, which facilitates smooth execution of subsequent process, and then the second sub-dielectric layer made of the thermosetting dielectric material is applied on the basis of the first sub-dielectric layer made of the viscous dielectric material, so that the bridging layer is embedded in the first dielectric layer composed of two or more sub-dielectric layers made of different materials.

Further, in some embodiments of the disclosure, the substrate may be made of an organic polymer material or a glass material. The two materials have a stable chemical property, high temperature resistance, corrosion resistance and a good insulation performance, and may maintain a good stability in a process of manufacturing a semiconductor, so that the manufacturing of the semiconductor may be carried out normally.

Figure 3:
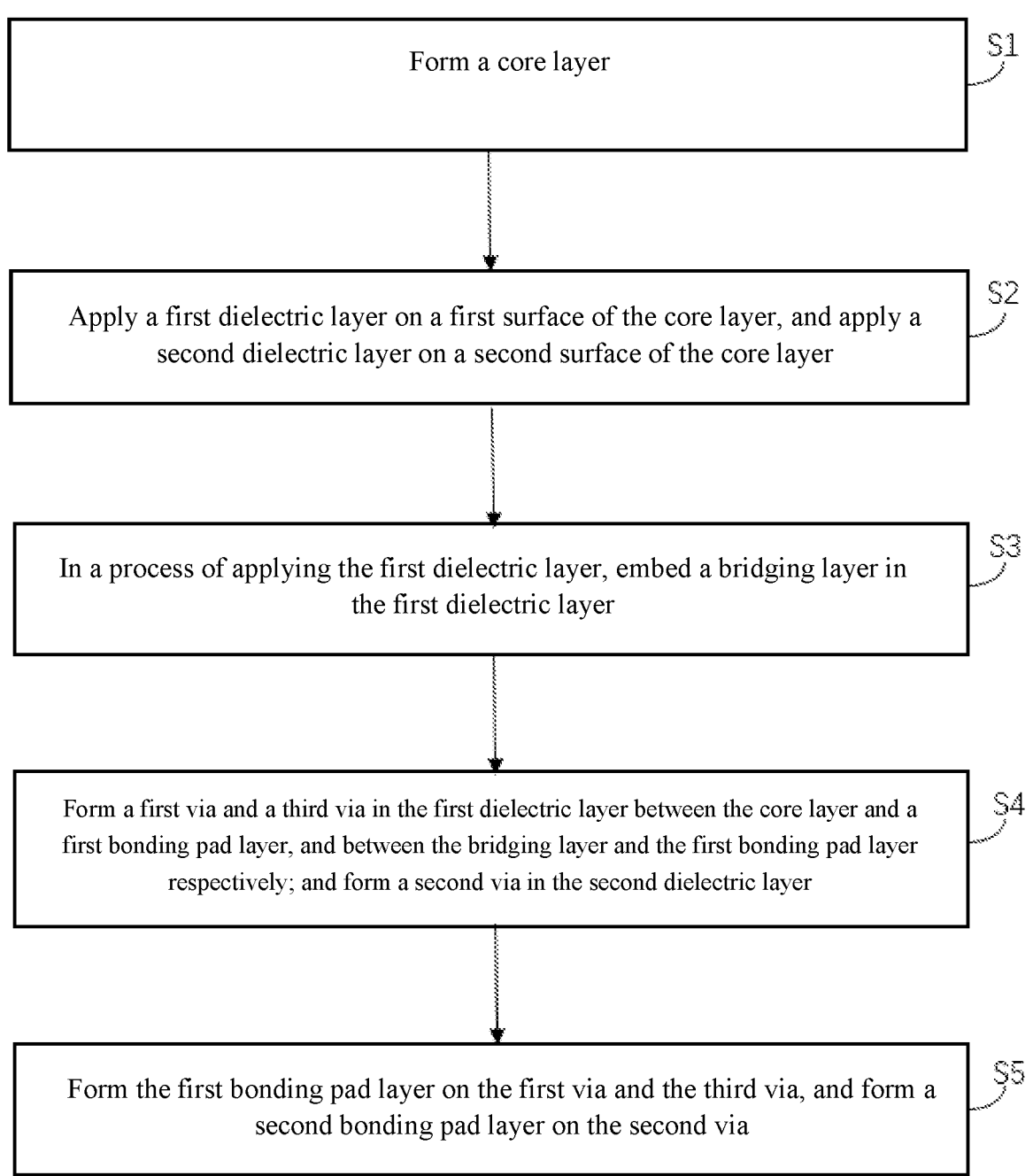
FIG. 3 is a flow chart of a manufacturing method of a packaging structure for realizing chip interconnection according to an embodiment of the disclosure.

In addition, with reference to FIG. 3, corresponding to the packaging structure for realizing chip interconnection in FIG. 1, embodiments of the disclosure further provide a manufacturing method of a packaging structure for realizing chip interconnection, which may be used for manufacturing the packaging structure for realizing chip interconnection according to any one of the above embodiments, and may comprise the following steps.

In S1, the core layer is formed.

In the embodiment of the disclosure, the core layer may be divided into a substrate, one or more circuit layers, and a dielectric layer. The circuit layer is an electric circuit layer capable of realizing a specific electric circuit function. When the electric circuit is relatively simple, one circuit layer may be provided. When one circuit layer is insufficient to complete the functions of the whole module, the core layer may comprise two or more circuit layers. When the electric circuit includes a hybrid electric circuit, the core layer may also comprise two or more circuit layers. For example, a high-speed electric circuit such as a digital logic electric circuit with a frequency reaching or exceeding 45 MHz to 50 MHz and a low-speed electric circuit such as a digital logic electric circuit with a frequency less than 45 MHz to 50 MHz need certain signal isolation, and corresponding electric circuits need to be arranged in different layers. Correspondingly, it is necessary to arrange different circuit layers on two opposite surfaces of the substrate. Specifically, based on the consideration of electric circuit integration degree and electric circuit function realization in the disclosure, the core layer is divided into different layers comprising a substrate, a first sub-circuit layer, a second sub-circuit layer, a third sub-circuit layer, a fourth sub-circuit layer, a third dielectric layer and a fourth dielectric layer.

In S2, the first dielectric layer is applied on the first surface of the core layer; and the second dielectric layer is applied on the second surface of the core layer.

Specifically, in the manufacturing process, the first dielectric layer may be applied on the first surface first, and after the first dielectric layer is applied, the second dielectric layer is applied on the other opposite surface. When the first dielectric layer is applied on the first surface, because the first dielectric layer may be formed by layering and stacking many different materials, in the process of applying the first dielectric layer, the first sub-dielectric layer made of the viscous dielectric material may be applied first, and then the second sub-dielectric layer made of the thermosetting material or the photosensitive material may be applied on the basis of the first sub-dielectric layer. The first sub-dielectric layer and the second sub-dielectric layer jointly form the first dielectric layer.

In S3, in a process of applying the first dielectric layer, the bridging layer is embedded in the first dielectric layer.

In the specific manufacturing process, the first sub-dielectric layer may be arranged in the first dielectric layer first, and then the bridging layer may be arranged on a surface of one side of the first sub-dielectric layer opposite to the core layer. When no more than two connection bridges in the bridging layer are provided, the connection bridges may be arranged in any positions at an interval, and when more than two connection bridges are provided, the connection bridges may be arranged at an equal interval or at unequal intervals. After the connection bridges are arranged, the second sub-dielectric layer is applied above each connection bridge and the first sub-dielectric layer. The two sub-dielectric layers may both be made of one of the viscous dielectric material, the thermosetting dielectric material or the photosensitive dielectric material, and the two sub-dielectric layers may be made of the same material or different materials. Specifically, in order to fix the connection bridge well in the manufacturing process in the disclosure, the first sub-dielectric layer may be made of the viscous dielectric material, and the second sub-dielectric layer may be made of the thermosetting material.

In S4, the first via and the third via are formed in the first dielectric layer. The first via is arranged between the core layer and the first bonding pad layer, and the third via is arranged between the bridging layer and the first bonding pad layer; and the second via is formed in the second dielectric layer.

Specifically, in some embodiments of the disclosure, when the first via is made, a region covering each bridging layer may be formed with a window first to realize the windowing of the first via, and then other region of the first dielectric layer may be formed with a window to realize the windowing of the third via. A windowing depth of the third via is greater than that of the first via, and the windowing may be implemented by using laser. Moreover, for the second via, in the same way, the second dielectric may be formed with a window by using laser. After windowing, the windows are metallized to finally form the first via, the second via and the third via capable of realizing electrical conduction.

In S5, the first bonding pad layer is formed on the first via and the third via, and the second bonding pad layer is formed on the second via.

Specifically, in some embodiments of the disclosure, the first bonding pad layer and the second bonding pad layer may be formed by electroplating, one first bonding pad layer with the same or different volume is electroplated on the first via and the third via, and one second bonding pad layer with the same or different volume is electroplated on the second via. In addition, a surface on one side where the first via and the third via are located and a surface on the other side where the second via is located may be electroplated at the same time during electroplating, so that the first bonding pad layer and the second bonding pad layer are formed at the same time, or the first via and the third via may be electroplated to form the first bonding pad layer first, and then the second via may be electroplated to form the second bonding pad layer.

Further, in some embodiments of the disclosure, the manufacturing method of a packaging structure for realizing chip interconnection may further comprise a step of S6 in which the chip is attached on the first bonding pad layer and the PCB is soldered on the second bonding pad layer.

Specifically, the first bonding pad layer may be used for connecting the chip with the core layer, or interconnecting multiple chips, and the second bonding pad layer may connect the core layer with the PCB, so that the electric circuit of the core layer may realize a specific role in the packaging structure for realizing chip interconnection. Therefore, in some embodiments, according to the packaging structure for realizing chip interconnection of the disclosure, the chip may be attached on the first bonding pad layer, and the PCB may be soldered on the second bonding pad layer.

Figure 4:
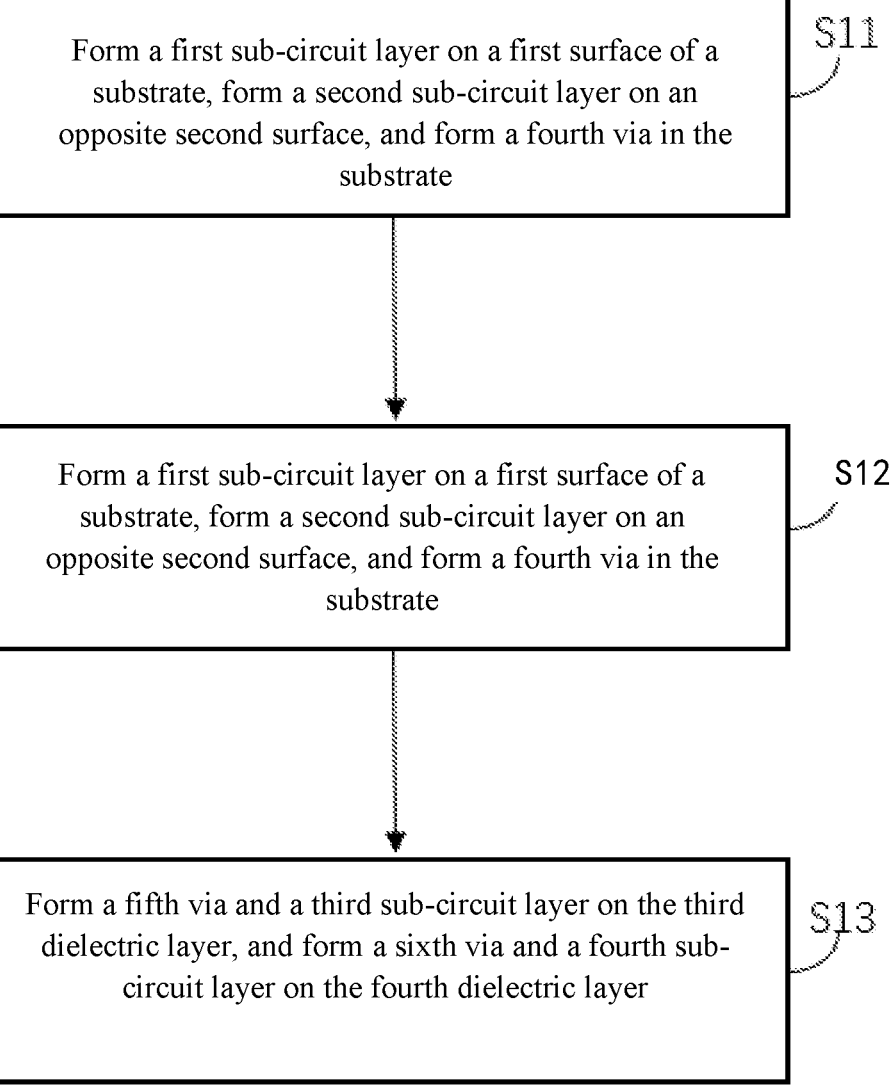
FIG. 4 is a flow chart of forming the core layer in the manufacturing method of a packaging structure for realizing chip interconnection according to an embodiment of the disclosure.

Further, with reference to FIG. 4, in some embodiments of the disclosure, the above step S1 may comprise the following steps.

In S11, the first sub-circuit layer is formed on the first surface of the substrate, the second sub-circuit layer is formed on the opposite second surface, and the fourth via is formed in the substrate.

Specifically, in this step, a hole is drilled in the substrate, and then the drilled hole is metallized to form the fourth via. The hole metallization may be realized by a copper melting or metal sputtering process, and the fourth via is filled and electroplated to form the first sub-circuit layer and the second sub-circuit layer.

In S12, the third dielectric layer is applied on the first sub-circuit layer and the fourth dielectric layer is applied on the second sub-circuit layer, and the third dielectric layer and the fourth dielectric layer are formed with windows.

Specifically, the third dielectric layer may be made of a thermosetting insulating material or a photosensitive insulating material, and the fourth dielectric layer may be made of a thermosetting insulating material or a photosensitive insulating material. During application, the third dielectric layer needs to completely cover the whole first sub-circuit layer, while the fourth dielectric layer needs to completely cover the second sub-circuit layer, so as to ensure that the first sub-circuit layer and the second sub-circuit layer are partially insulated from other subsequent circuit layers. After the third dielectric layer and the fourth dielectric layer are applied, the third dielectric layer may be formed with a window, and different method for forming window may be selected according to dielectric materials. For example, the dielectric layer made of the photosensitive insulating material may formed with a window by exposure and development, or by using laser, while the dielectric layer made of the thermosetting material may be formed with a window by using laser.

In S13, the fifth via and the third sub-circuit layer are formed on the third dielectric layer, and the sixth via and the fourth sub-circuit layer are formed on the fourth dielectric layer.

Specifically, a metal seed layer may be made on surfaces of the third dielectric layer and the fourth dielectric layer, the seed layer may be made by the copper melting or metal sputtering process. After the metal seed layer is made, a mask is applied on the dielectric layer, and then a circuit pattern layer is made by exposure and development. After the circuit pattern is made, the multiple windows formed by windowing in the step S12 are electroplated to finally form the vias. After electroplating, the mask is stripped. Finally, the metal seed layer is etched by dry or wet etching to finally form the fifth via, the sixth via, the third sub-circuit layer and the fourth sub-circuit layer.

Taking the packaging structure for realizing chip interconnection composed of two connection bridges as an example, a manufacturing process of the packaging structure for realizing chip interconnection in the embodiment of the disclosure is described below.

The core layer is made first.

Figure 5:
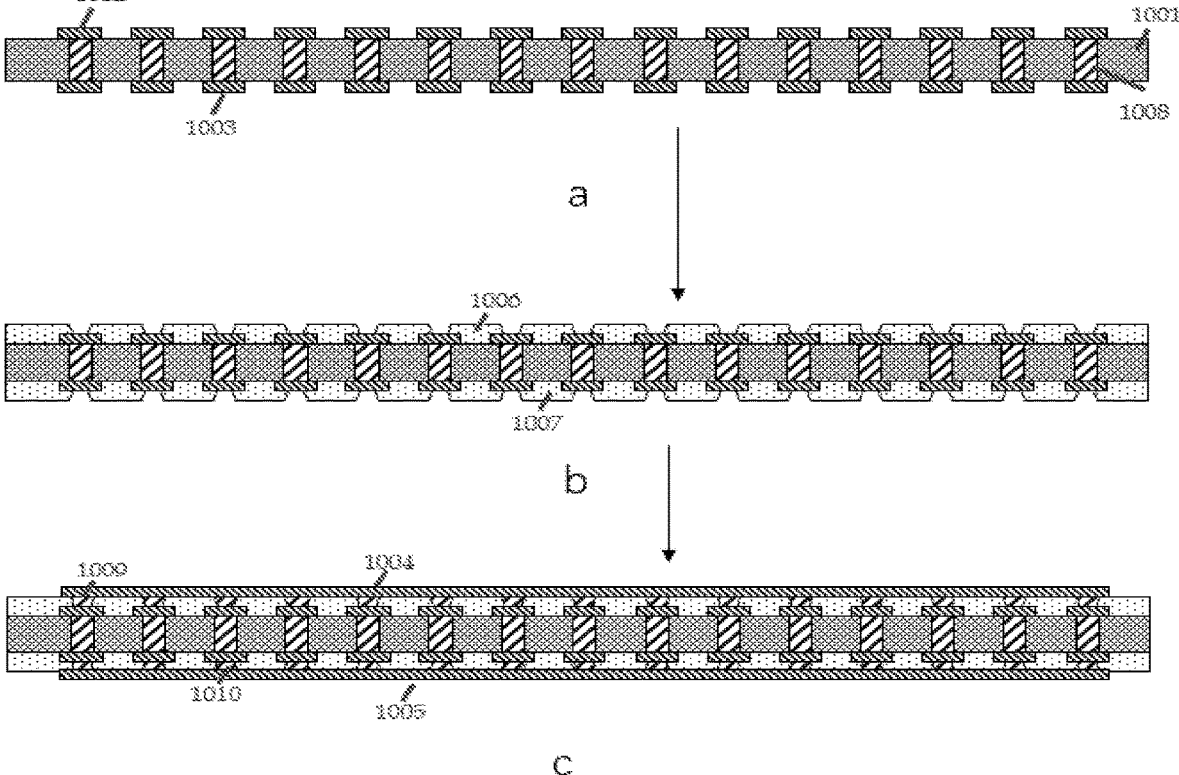
FIG. 5 is a schematic diagram of a structure change of forming the core layer in the manufacturing method of a packaging structure for realizing chip interconnection according to an embodiment of the disclosure.

A first step of making the core layer may refer to (a) in FIG. 5, in which a hole may be drilled in the substrate 1001 first to form a through hole, then the through hole is metallized to form a via capable of conducting surfaces on two opposite sides of the substrate, and finally, the via is filled and electroplated to form the first via 1008, the first circuit layer 1002 and the second circuit layer 1003 in the figure. The substrate 1001 may be made of an organic polymer, a glass material, and the like. In a second step, with reference to (b) in FIG. 5, the third dielectric layer 1006 and the fourth dielectric layer 1007 are respectively applied on the first circuit layer and the second circuit layer of the core layer and formed with multiple windows, and the multiple windows may be used for making subsequent vias. In a final step, with reference to (c) in FIG. 5, the metal seed layer is made on the surfaces of the third dielectric layer 1006 and the fourth dielectric layer 1007, and after the metal seed layer is made, the mask is applied on the dielectric layer, and then the circuit pattern layer is made by exposure and development. After the circuit pattern is made, the dielectric is formed a window for electroplating. After electroplating, the mask is stripped. Finally, the metal seed layer is etched by a dry method to finally form the fifth via 1009, the sixth via 1010, the third sub-circuit layer 1004 and the fourth sub-circuit layer 1005.

Secondly, other parts of the packaging structure for realizing chip interconnection are made.

Figure 6:
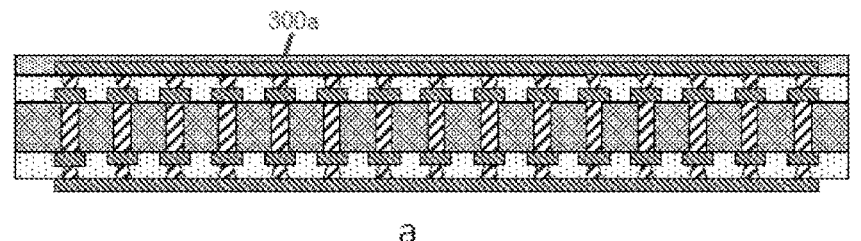
FIG. 6 is a schematic diagram of a structure change during manufacturing of the packaging structure for realizing chip interconnection according to an embodiment of the disclosure.
Figure 6:
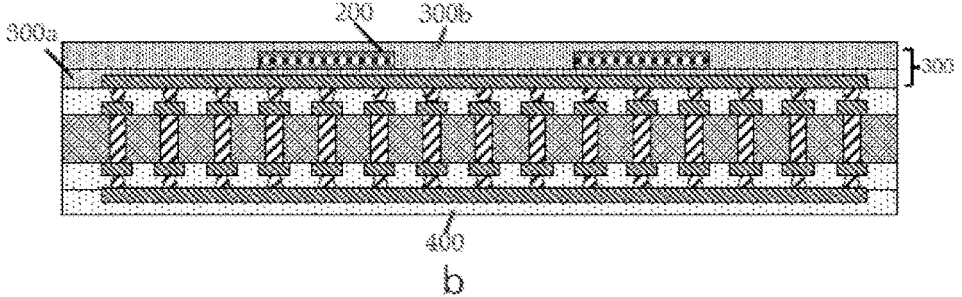
Figure 6:
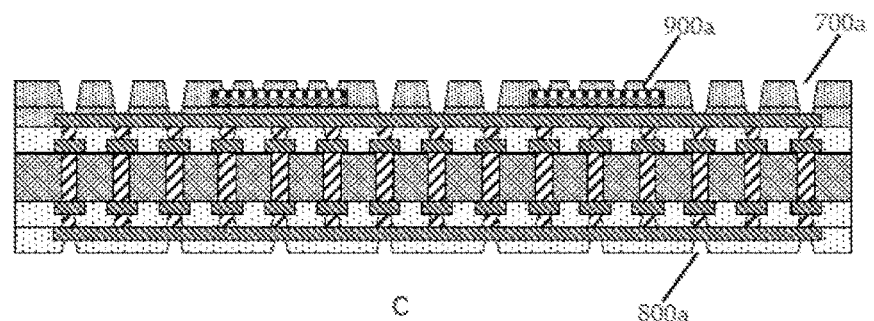
Figure 6:
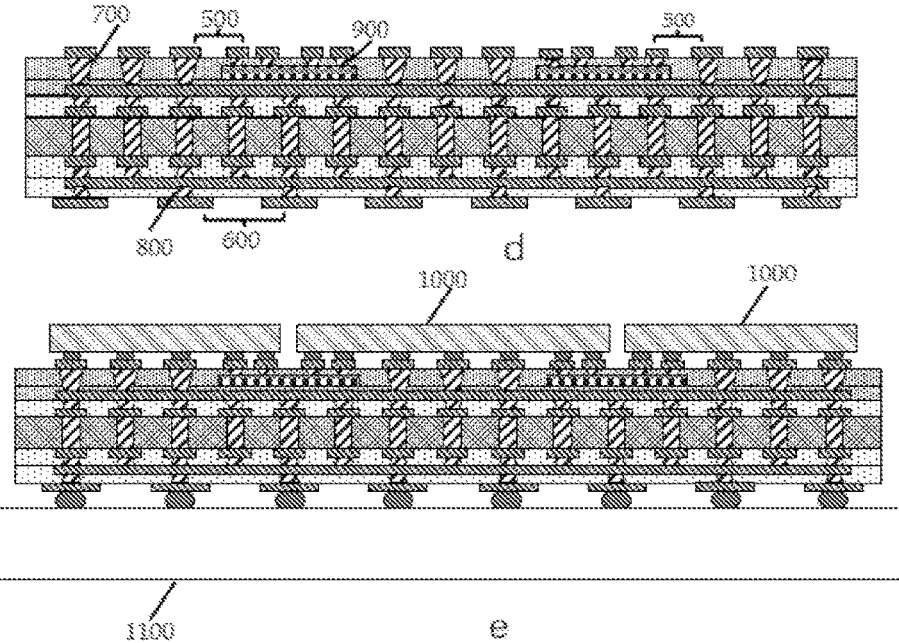

With reference to FIG. 6, the first dielectric layer and the second dielectric layer are applied to the surfaces on two sides of the core layer in the above step first. With reference to (a) and (b) in FIG. 6, when the first dielectric layer is applied, it is necessary to apply one first sub-dielectric layer 300a made of the viscous material first, the first sub-dielectric layer 300a needs to completely cover the surface on one side of the core layer, and two connection bridges are placed on the surface of the first sub-dielectric layer at an interval. Because the first sub-dielectric layer is made of the viscous material, the viscous dielectric layer may help to fix the two connection bridges, so that the connection bridges 200 will not shift in subsequent process. After the first sub-dielectric layer is applied, the second sub-dielectric layer 300b needs to be applied on the first sub-dielectric layer and the connection bridges 200, and the second sub-dielectric layer 300b needs to completely cover the first sub-dielectric layer 300a and the two connection bridges 200, so as to finally complete the application of the first dielectric layer. For the application of the second dielectric layer, because the second dielectric layer in the embodiment is only made of the thermosetting material, the second dielectric layer 400 may be directly applied on the surface on one side of the core layer opposite to the first dielectric layer. It is worth noting that the second dielectric layer 400 also needs to completely cover the core layer. After the first dielectric layer and the second dielectric layer are applied, the first dielectric layer and the second dielectric layer need to be formed with windows. With reference to (c) in FIG. 6, when the dielectric layer is formed with windows, the dielectric layer above the connection bridges in the first dielectric layer may be formed with windows by exposure and development first to form multiple third windows 900a, and then the remaining place of the first dielectric layer is formed with multiple first windows 700a. Similarly, the second dielectric layer may also be formed with windows by using laser to form multiple second windows 800a in the second dielectric layer. After windowing, the first via, the second via, the third via, the first bonding pad layer and the second bonding pad layer need to be made on two surfaces. With reference to (d) in FIG. 6, the first via 700, the second via 800 and the third via 900 are formed by hole filling and electroplating, and the making of the metal seed layer, the making of the circuit pattern, the electroplating, the mask stripping and the etching of the metal seed layer are carried out on the first dielectric layer 300 and the second dielectric layer, so as to finally form the first bonding pad layer 500 on the via 700 and the via 900 and form the second bonding pad layer 600 on the via 800. Finally, multiple chips may be interconnected through the first bonding pad layer 500, and the chips may be directly connected with the core layer; and the core layer may be connected with the PCB through the second bonding pad layer 600. Finally, with reference to (e) in FIG. 6, after the first bonding pad layer and the second bonding pad layer are made, a plurality of chips 1000 may be soldered on the first bonding pad layer to interconnect the chips, and a PCB 1100 may also be soldered on the second bonding pad layer to integrate the chips with the PCB.

In some optional embodiments, the functions/operations mentioned in the block diagram may occur without following the sequence mentioned in the operation diagram. For example, depending on the functions/operations involved, two blocks shown consecutively may actually be executed substantially simultaneously or the blocks may sometimes be executed in the reverse sequence. In addition, the embodiments presented and described in the flow chart of the disclosure are provided by way of example, with the purpose of providing more comprehensive understanding of the technology. The disclosed method is not limited to the operation and logic flow presented herein. The optional embodiments are expectable, where a sequence of various operations is changed and a sub-operation described as a part of a large-scale operation is independently executed.

In the descriptions above in the specification, the descriptions of the reference terms "one implementation or embodiment", "another implementation or embodiment" or "some implementations or embodiments" refer to that the specific features, structures, materials, or characteristics described in combination with the implementation or example are included in at least one implementation or example of the disclosure. In the specification, the schematic expressions of the above terms do not necessarily refer to the same implementation or example. Furthermore, the specific features, structures, materials, or characteristics described may be combined in any one or more implementations or examples in a suitable manner.

Although the implementations of the disclosure have been shown and described, those of ordinary skills in the art should understand that: various changes, amendments, substitutions and modifications can be made to these implementations without departing from the principles and purposes of the disclosure, and the scope of the disclosure is limited by the claims and equivalents thereof.

The foregoing describes the preferred embodiments of the disclosure in detail, but the disclosure is not limited to the above embodiments. Those of ordinary skills in the art may further make various equivalent modifications or substitutions without violating the gist of the disclosure, and these equivalent modifications or substitutions are included in the scope defined by the claims of the disclosure.

What is claimed is:

1. A packaging structure for realizing chip interconnection, used for being connected with a PCB, and comprising:
   a core layer, a bridging layer, a first dielectric layer, a second dielectric layer, a first via, a second via, a third via, a first bonding pad layer and a second bonding pad layer;
   wherein, the first dielectric layer is arranged on a first surface of the core layer; and the second dielectric layer is arranged on a second surface of the core layer opposite to the first surface,
   the first dielectric layer comprises a first sub-dielectric layer and a second sub-dielectric layer; the first sub-dielectric layer, the bridging layer, and the second sub-dielectric layer are sequentially arranged on the first surface; the first sub-dielectric layer is configured to stick and fix the bridging layer;
   the first dielectric layer is arranged between the core layer and the first bonding pad layer; the second dielectric layer is arranged between the second bonding pad layer and the core layer; the first bonding pad layer is connected with the core layer through the first via; the second bonding pad layer is connected with the core layer through the second via; the bridging layer is embedded in the first dielectric layer; the bridging layer is electrically insulated from the core layer; and the bridging layer is connected with the first bonding pad layer through the third via; and
   the first bonding pad layer is used for being connected with a chip; the second bonding pad layer is used for being connected with the PCB; and the bridging layer is used for interconnecting two chips.

2. The packaging structure for realizing chip interconnection according to claim 1, wherein the core layer comprises:

a substrate, a first sub-circuit layer, a second sub-circuit layer, a third sub-circuit layer, a fourth sub-circuit layer, a fourth via, a fifth via, a sixth via, a third dielectric layer and a fourth dielectric layer;

wherein, the first sub-circuit layer is arranged on a first surface of the substrate; the second sub-circuit layer is arranged on a second surface of the substrate opposite to the first surface, and the first sub-circuit layer and the second sub-circuit layer are connected through the fourth via; and the fourth via is arranged in the substrate;

the third dielectric layer is arranged between the third sub-circuit layer and the first sub-circuit layer; and the third sub-circuit layer and the first sub-circuit layer are connected through the fifth via arranged in the third dielectric layer; and the fourth dielectric layer is arranged between the fourth sub-circuit layer and the second sub-circuit layer; and the fourth sub-circuit layer and the second sub-circuit layer are connected through the sixth via arranged in the fourth dielectric layer.

3. The packaging structure for realizing chip interconnection according to claim 2, wherein the substrate comprises an organic polymer material or a glass material.

4. The packaging structure for realizing chip interconnection according to claim 1, wherein the bridging layer comprises one or more connection bridges.

5. The packaging structure for realizing chip interconnection according to claim 1, wherein the bridging layer comprises at least one of a thin film circuit layer, a silicon intermediate layer, a glass intermediate layer or a chip.

6. The packaging structure for realizing chip interconnection according to claim 1, wherein the first dielectric layer comprises at least one of a viscous dielectric material, a thermosetting dielectric material or a photosensitive dielectric material.

7. A semiconductor device, comprising at least one packaging structure for realizing chip interconnection according to claim 1.

8. A manufacturing method of a packaging structure for realizing chip interconnection, used for manufacturing the packaging structure for realizing chip interconnection according to claim 1, and comprising:

forming the core layer;

applying the first dielectric layer on a first surface of the core layer; and applying the second dielectric layer on a second surface of the core layer, the first dielectric layer comprises a first sub-dielectric layer and a second sub-dielectric layer, the first sub-dielectric layer is configured to stick and fix a bridging layer;

in a process of applying the first dielectric layer, embedding the bridging layer in the first dielectric layer, wherein the first sub-dielectric layer covers a surface on one side of the core layer, and the bridging layer is placed on a surface of the first sub-dielectric layer, the second sub-dielectric layer is applied on the first sub-dielectric layer and the bridging layer, and the second sub-dielectric layer completely covers the first sub-dielectric layer and the bridging layer;

forming the first via and the third via in the first dielectric layer; arranging the first via between the core layer and the first bonding pad layer, and arranging the third via between the bridging layer and the first bonding pad layer; and forming the second via in the second dielectric layer; and forming the first bonding pad layer on the first via and the third via, and forming the second bonding pad layer on the second via.

9. The manufacturing method of a packaging structure for realizing chip interconnection according to claim 8, further comprising: attaching the chip on the first bonding pad layer and soldering the PCB on the second bonding pad layer.

10. The manufacturing method of a packaging structure for realizing chip interconnection according to claim 8, wherein forming the core layer comprises:

forming a first sub-circuit layer on a first surface of a substrate, forming a second sub-circuit layer on an opposite second surface, and forming a fourth via in the substrate;

applying a third dielectric layer on the first sub-circuit layer and applying a fourth dielectric layer on the second sub-circuit layer, and forming windows in the third dielectric layer and the fourth dielectric layer; and forming a fifth via and a third sub-circuit layer on the third dielectric layer, and forming a sixth via and a fourth sub-circuit layer on the fourth dielectric layer.

\* \* \* \* \*